United States Patent
Burr et al.

(10) Patent No.: US 12,255,656 B2
(45) Date of Patent: Mar. 18, 2025

(54) SPLIT PULSE WIDTH MODULATION TO REDUCE CROSSBAR ARRAY INTEGRATION TIME

(71) Applicant: International Business Machines Corporation, Armonk, NY (US)

(72) Inventors: Geoffrey Burr, Cupertino, CA (US); Masatoshi Ishii, Yokohama (JP); Pritish Narayanan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 577 days.

(21) Appl. No.: 17/555,178

(22) Filed: Dec. 17, 2021

(65) Prior Publication Data

US 2023/0198511 A1 Jun. 22, 2023

(51) Int. Cl.
*H03K 7/08* (2006.01)
*G06N 3/04* (2023.01)
*G11C 13/00* (2006.01)
*H03M 3/00* (2006.01)

(52) U.S. Cl.
CPC .......... *H03K 7/08* (2013.01); *G06N 3/04* (2013.01); *H03M 3/424* (2013.01); *G11C 2013/0052* (2013.01); *G11C 2013/0092* (2013.01)

(58) Field of Classification Search
CPC .............. H03K 7/08; G11C 2013/0052; G11C 2013/0092
USPC ................................................. 365/189.011
See application file for complete search history.

(56) References Cited

U.S. PATENT DOCUMENTS

| | | | |
|---|---|---|---|
| 10,007,517 B2 | 6/2018 | Buchanan et al. | |
| 10,367,480 B1* | 7/2019 | Kreider | H03K 3/017 |
| 10,694,597 B2* | 6/2020 | Watsuda | H05B 45/10 |
| 2016/0232951 A1* | 8/2016 | Shanbhag | G11C 11/419 |
| 2019/0044506 A1* | 2/2019 | Naumann | H03K 7/00 |

OTHER PUBLICATIONS

Chen et al., "Multiply accumulate operations in memristor crossbar arrays for analog computing," Journal of Semiconductors, vol. 42, 2021, pp. 1-22.
Yamaguchi et al., An Energy-Efficient Time-Domain Analog CMOS BinaryConnect Neural Network Processor Based on a Pulse-Width Modulation Approach, IEEE Access, Dec. 28, 2020, pp. 2644-2654.
Ali et al., "IMAC: In-memory multi-bit Multiplication and ACcumulation in 6T SRAM Array," IEEE Transactions on Circuits and Systems-I Journal, 2020, pp. 1-11.

(Continued)

*Primary Examiner* — Anthan Tran
(74) *Attorney, Agent, or Firm* — Zilka-Kotab, P.C.

(57) ABSTRACT

A computer-implemented method, according to one embodiment, includes: causing a multi-bit input to be split into two or more chunks, where each of the two or more chunks include at least one individual bit. Each of the two or more chunks are also converted into a respective pulse width modulated signal, and a partial result is generated in digital form for each of the respective pulse width modulated signals. Each of the partial results are scaled by a respective significance factor corresponding to each of the two or more chunks, and the scaled partial results are also accumulated.

20 Claims, 11 Drawing Sheets

(56) References Cited

OTHER PUBLICATIONS

Paliy et al., "Analog Vector-Matrix Multiplier Based on Programmable Current Mirrors for Neural Network Integrated Circuits," IEEE Access, vol. 8, Nov. 19, 2020, pp. 203525-203537.

Mileiko et al., "Neural network design for energy-autonomous artificial intelligence applications using temporal encoding," Philosophical Transactions of the Royal Society A, vol. 378, 2019, pp. 1-29.

Sayal et al., "COMPAC: Compressed Time-Domain, Pooling-Aware Convolution CNN Engine With Reduced Data Movement for Energy-Efficient AI Computing," IEEE Journal of Solid-State Circuits, 2020, pp. 1-16.

\* cited by examiner

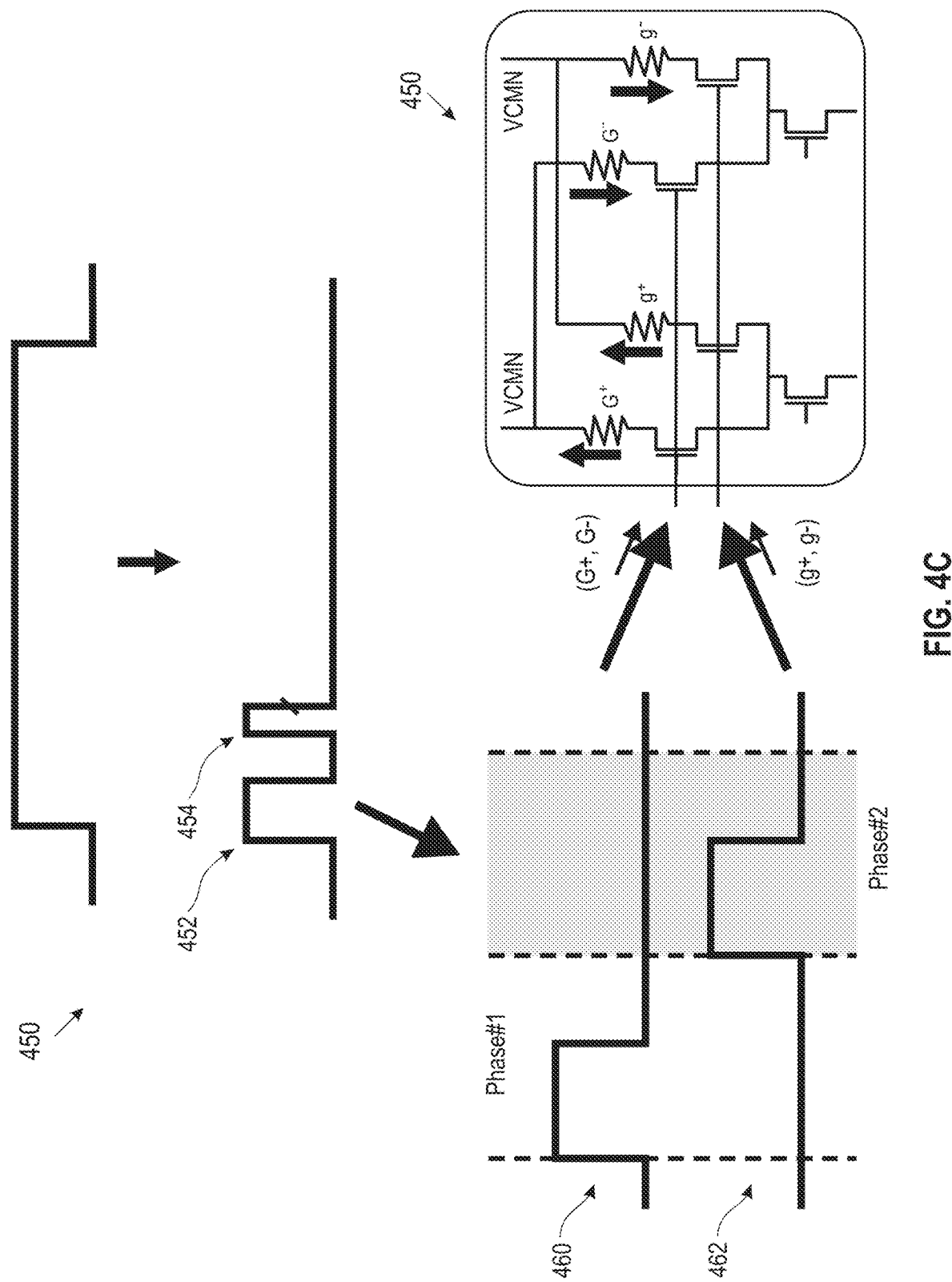

SPLIT PULSE WIDTH MODULATION TO REDUCE CROSSBAR ARRAY INTEGRATION TIME

BACKGROUND

The present invention relates to crossbar arrays, and more specifically, this invention relates to implementing split pulse width modulation such that integration with the rows and columns of analog crossbar arrays is reduced temporally.

The performance characteristics of conventional random access memory (RAM) are fundamentally different from those of traditional hard disk drives (HDDs). For instance, using RAM-based solid state drives (SSDs) as an example, data in conventional implementations is typically organized in pages of 4, 8, or 16 KB sizes. Moreover, page read operations are typically one order of magnitude faster than write operations and latency neither depends on the current nor the previous location of operations.

Resistive RAM (RRAM) and Phase Change Memory (PCM) are specific types of random access memory that acts as a programmable resistor. Small voltages applied to PCM or RRAM devices for given amounts of time allows for the conductance of the corresponding cells to be determined, while larger voltages can be used to actually change the resistance of the cells. It follows that both PCM and RRAM may be used to construct analog crossbar arrays which are able to combine computation and data access. Specifically, analog crossbar arrays may be used to perform parallel read and write operations using the pulse width modulator assigned to each of the different rows and columns in the array. This combination is achieved in some instances by providing large-scale processing in memory with a multiplier and adder at each real-valued memory location.

In implementations of RRAM, PCM, etc. that are configured as crossbar arrays for which each row excitation is applied as a different length pulse, a pulse width modulator (PWM) is assigned to each row of the crossbar array. While a large bit precision is desired for accuracy, the maximum pulse duration undesirably scales another two times longer in duration for each additional bit of precision.

One conventional attempt to overcome this detriment involves bit-slicing the input signal and implementing one equal-length integration time-period for each bit of data. In order to scale the output correctly in these conventional attempts, the integrated output within each bit-sliced time-period is scaled by $2^n$, where "n" is zero or the appropriate positive integer reflecting the importance of the particular bit-slice. However, these conventional implementations also introduce a significant amount of quantization error. These errors can be somewhat improved if each bit-sliced integration time-period is long enough to measure a signal of sufficient dynamic range, but this in turn introduces further temporal-based inefficiencies.

Thus, there is a desire to provide pulse width modulation that can result in sufficient accuracy and a larger bit-precision without the maximum pulse duration becoming undesirably long as has plagued such conventional attempts.

SUMMARY

A computer-implemented method, according to one embodiment, includes: causing a multi-bit input to be split into two or more chunks, where each of the two or more chunks include at least one individual bit. Each of the two or more chunks are also converted into a respective pulse width modulated signal, and a partial result is generated in digital form for each of the respective pulse width modulated signals. Each of the partial results are scaled by a respective significance factor corresponding to each of the two or more chunks, and the scaled partial results are also accumulated.

A computer program product, according to another embodiment, includes a computer readable storage medium having program instructions embodied therewith. Moreover, the program instructions are readable and/or executable by a processor to cause the processor to perform the foregoing method.

A system, according to yet another embodiment, includes: a processor, and logic that is integrated with the processor, executable by the processor, or integrated with and executable by the processor. Furthermore, the logic is configured to perform the foregoing method.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIGS. 4B-4D are representational diagrams of encoding multi-bit neural network activations in the time domain, in accordance with three different embodiments.

DETAILED DESCRIPTION

Figure 1:
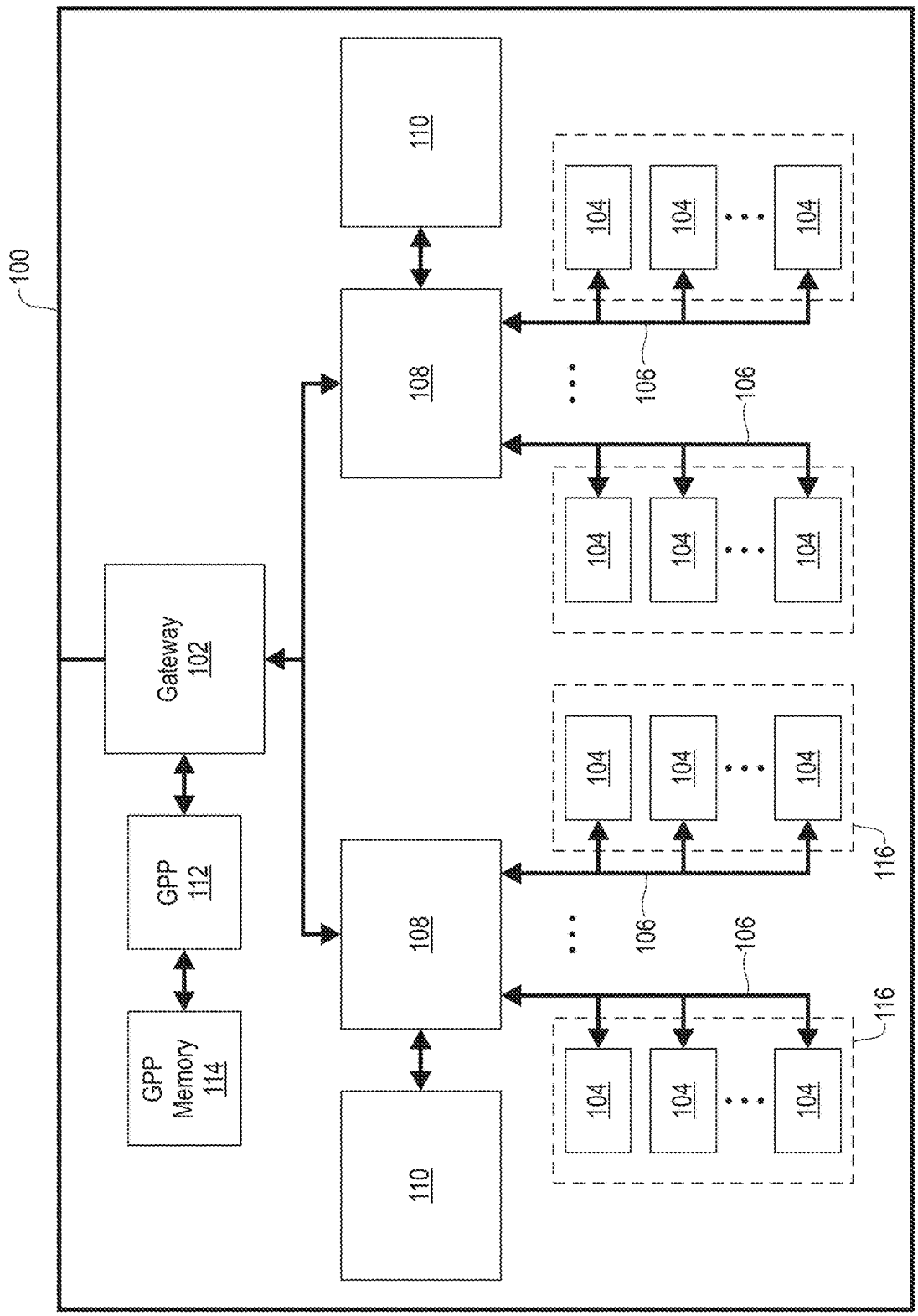
FIG. 1 is a partial schematic diagram of a non-volatile memory module, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of crossbar arrays, as well as operation and/or component parts thereof for significantly reducing time delays experienced, particularly while satisfying multi-bit inputs. By dividing this input into chunks, each of which have a different significance factor, various ones of the embodiments herein are able to desirably limit quantization errors and actually improve temporal-based efficiencies, e.g., as will be described in further detail below.

It should also be appreciated that various embodiments herein may be implemented with a wide range of memory mediums, including for example non-volatile RAM (NVRAM) technologies such as spin-transfer torque RAM (STT-RAM), phase-change memory (PCM), magnetoresistive RAM (MRAM), etc. However, to provide a context and assist the reader, various embodiments included herein may be described with reference to specific types of non-volatile memory, e.g., such as RRAM and PCM. This has been done by way of example only, and should not be deemed limiting on the invention.

In one general embodiment, a computer-implemented method includes: causing a multi-bit input to be split into two or more chunks, where each of the two or more chunks include at least one individual bit. Each of the two or more chunks are also converted into a respective pulse width modulated signal, and a partial result is generated in digital form for each of the respective pulse width modulated signals. Each of the partial results are scaled by a respective significance factor corresponding to each of the two or more chunks, and the scaled partial results are also accumulated.

In another general embodiment, a computer program product includes a computer readable storage medium having program instructions embodied therewith. Moreover, the program instructions are readable and/or executable by a processor to cause the processor to: perform the foregoing method.

In yet another general embodiment, a system includes: a processor, and logic that is integrated with the processor, executable by the processor, or integrated with and executable by the processor. Furthermore, the logic is configured to: perform the foregoing method.

FIG. 1 illustrates a memory module 100, in accordance with one embodiment. It should be noted that although memory module 100 is depicted as an exemplary non-volatile data storage module in the present embodiment, various other types of non-volatile data storage modules may be used in a data storage system according to alternate embodiments. It follows that the architecture and/or components of memory module 100 are in no way intended to limit the invention, but rather have been presented as a non-limiting example.

Moreover, as an option, the present memory module 100 may be implemented in conjunction with features from any other embodiment listed herein, such as those described with reference to the other FIGS. However, such memory module 100 and others presented herein may be used in various applications and/or in permutations which may or may not be specifically described in the illustrative embodiments listed herein. Further, the memory module 100 presented herein may be used in any desired environment.

With continued reference to FIG. 1, memory module 100 includes a gateway 102, a general purpose processor (GPP) 112 (such as an ASIC, FPGA, CPU, etc.) connected to a GPP memory 114 (which may include RAM, ROM, battery-backed DRAM, phase-change memory PC-RAM, MRAM, STT-MRAM, etc., or a combination thereof), and a number of memory controllers 108. Each memory controller 108 is connected to a plurality of RAM modules 104 (e.g., memory circuits) via channels 106. Moreover, subsets of the RAM modules 104 are arranged to form dual in-line memory modules (DIMMs) 116. In some approaches the RAM modules 104 may actually include RRAM, but it should be noted that the various RAM modules 104 may include any other type(s) of non-volatile memory in other approaches.

According to various embodiments, one or more of the controllers 108 may be and/or include one or more processors, and/or any logic for controlling any subsystem of the memory module 100. For example, the controllers 108 typically control the functions of RAM modules 104, e.g., such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, one or more of the controllers 108 may be configured and/or programmable to perform or control some or all of the methodology presented herein. Thus, one or more of the controllers 108 may be considered to be configured to perform various operations by way of logic programmed into one or more chips, modules, blocks, etc.; software, firmware, other instructions being available to one or more processors, etc.; etc., and/or combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof. Moreover, memory module 100 may be implemented in various types of data storage systems, depending on the desired embodiment.

As previously mentioned, RAM and the corresponding LSA architectures implement out-of-place data storage. Accordingly, a memory page overwrite will result in writing the memory page data to a new location in memory, marking the old copy of the memory page data as invalid, and then updating the mapping information. It follows that each data operation involves accessing a different storage location in the RAM.

Moreover, RRAM is a specific type of random access memory that acts as a programmable resistor. Specifically, small voltages applied to RRAM for given amounts of time allows for the conductance of the corresponding cells to be determined, while larger voltages can be used to actually change the resistance of the cells. It follows that RRAM may be used to construct analog crossbar arrays which are able to combine computation and data access. This combination is achieved in some instances by providing large-scale processing in memory with a multiplier and adder at each real-valued memory location. Analog crossbar arrays are thereby able to perform parallel read and write operations using the pulse width modulators assigned to the different rows and columns in the array.

However, the amount of system resources that are consumed while performing multiple data operations in parallel, e.g., such as multiply and accumulate operations, data write operations, data read operations, etc., has been undesirably high in conventional implementations of RRAM, thereby leading to significant operating inefficiencies. For instance, pulse width modulators are involved with providing a formulation in which each row excitation is applied as a different length pulse.

While large bit precision is desired in configurations that involve crossbar arrays as it increases accuracy, the maximum pulse duration undesirably scales another two times longer in duration for each additional bit of precision that is added. One conventional attempt to overcome this detriment involves bit-slicing the input signal and implementing one equal-length integration time-period for each bit of data. In order to scale the output correctly in these conventional attempts, the integrated output within each bit-sliced time-period is scaled by $2^n$, where "n" is zero or the appropriate positive integer reflecting the importance of the particular bit-slice. However, these conventional implementations also introduce a significant amount of quantization error. These errors can be somewhat improved if each bit-sliced integration time-period is long enough to measure a signal of sufficient dynamic range, but this in turn introduces further temporal-based inefficiencies.

Thus, there is a desire to provide pulse width modulation that can result in sufficient accuracy and a larger bit-precision without the maximum pulse duration becoming undesirably long as has plagued such conventional attempts.

Figure 2:
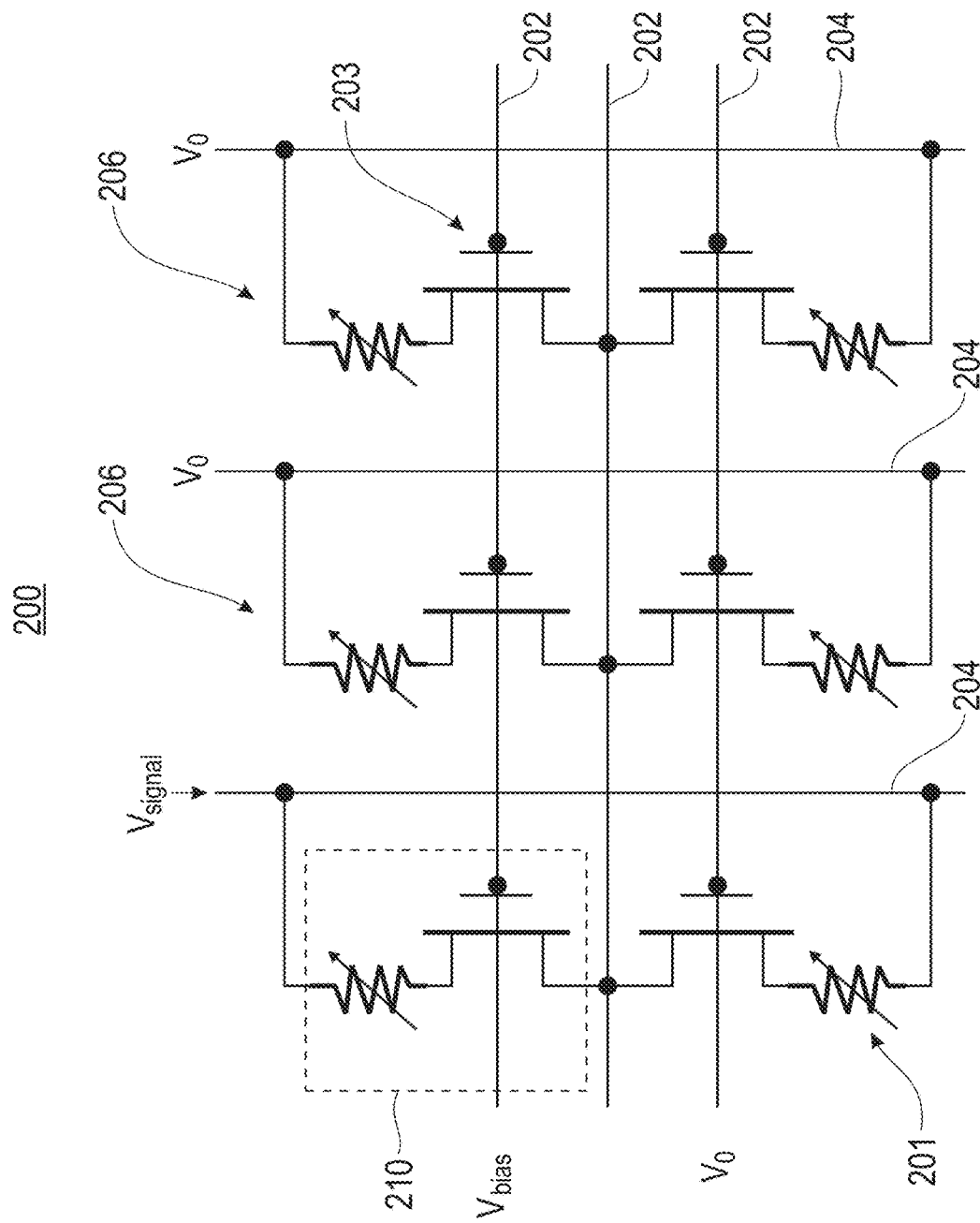
FIG. 2 is a partial schematic view of an analog crossbar array in RRAM, in accordance with one embodiment.

Looking now to FIG. 2, a partial, detailed schematic view of an analog crossbar array 200 in RRAM is depicted in accordance with one embodiment. As an option, the present crossbar array 200 may be implemented in conjunction with features from any other embodiment listed herein, such as those described with reference to the other FIGS., such as FIGS. 4A-6B below. However, such crossbar array 200 and others presented herein may be used in various applications and/or in permutations which may or may not be specifically described in the illustrative embodiments listed herein. Further, the crossbar array 200 presented herein may be used in any desired environment. Thus FIG. 2 (and the other FIGS.) may be deemed to include any possible permutation.

As shown, a number of resistor 201 and transistor 203 pairs are connected across a multitude of word lines 202 and bit lines 204 to form memory cells 206. Although these memory cells 206 are arranged in a grid-like pattern, the word lines 202 and bit lines 204 may be used to access any desired one of the memory cells 206. In other words, each of the memory cells 206 has a unique excitation vector that is associated therewith. These excitation vectors may further be implemented onto multiple different ones of the word lines 202 and/or bit lines 204 in order to perform operations like multiply, accumulate, etc., operations across an entire matrix of stored weights, e.g., as would be appreciated by one skilled in the art after reading the present description. Moreover, these weights may actually be encoded into the conductance values of analog RRAM in some approaches.

Looking to selected memory cell 210, a bias voltage $V_{bias}$ is applied to the gate terminal of the transistor 203 along the word line 202, thereby activating each of the transistors connected to the same word line 202. An electrical signal $V_{signal}$ is also applied to the bit line connected to the resistor 201 of the selected memory cell 210 for a predetermined amount of time in order to actually access the selected memory cell 210. The remainder of the word lines 202 and bit lines 204 have no voltage applied thereto $V_0$ which effectively keeps the corresponding circuits open and the various memory cells 206 other than the selected one 210 inactive, e.g., as would be appreciated by one skilled in the art after reading the present description.

It should also be noted that although not specifically depicted in FIG. 2, each of the word lines 202 and/or bit lines 204 include a pulse width modulator. For instance, although the bias voltage $V_{bias}$ associated with each of the transistors 203 may be predetermined, e.g., based on the configuration of the transistors themselves, and thereby applied relatively simply, the electrical signal $V_{signal}$ may vary depending on the particular situation. For instance, the pulse width of the electrical signal $V_{signal}$ applied to a given bit line 204 may dictate which of the transistors are actually accessed and how.

Figure 3:
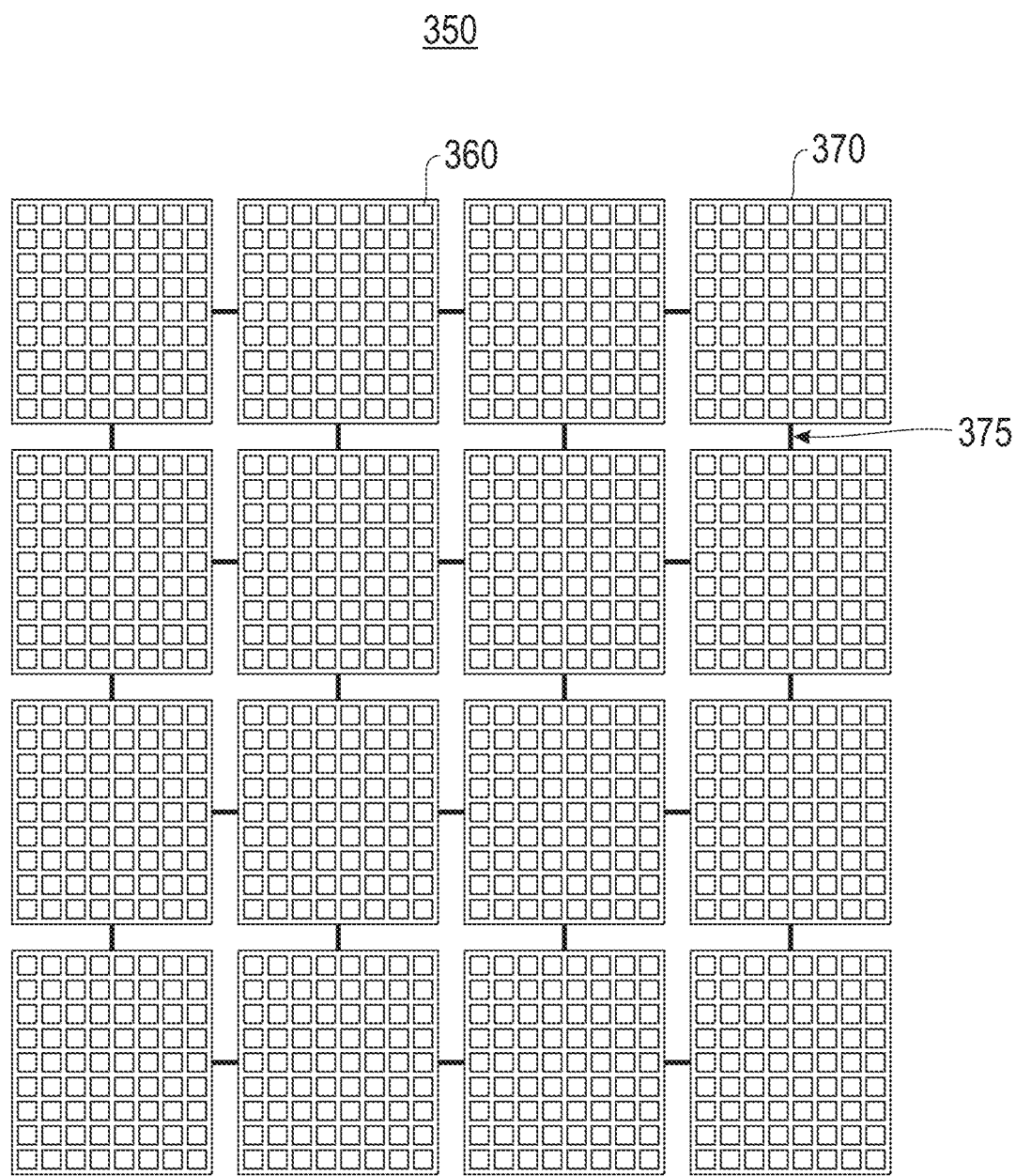
FIG. 3 is a partial representational view of a neural network, in accordance with one embodiment.

Moreover, looking to FIG. 3, an example of a neural network 350 is illustrated in accordance with one embodiment. As shown, the neural network 350 is a scalable neuromorphic architecture which includes multiple chip structures 370. Each chip structure 370 is illustrated as including multiple different cores 360. An event routing system 375 of the neural network 350 may also be used to route excitation events between each of the cores 360 of the chip structures 370. A core 360 of the neural network 350 may even send excitation event information to, and receive excitation event information from, a different core 360 of the same chip structure 370 or a different chip structure, e.g., depending on the approach.

It follows that neural network 350 is effectively a hardware-based neural network that is able to efficiently perform large-scale parallel multiply-accumulation (MAC) operations e.g., based on Ohm's and Kirchhoff's laws. By introducing excitation vectors onto multiple row-lines in order to perform multiply and accumulate operations across an entire matrix of stored weights encoded into the conductance values of analog nonvolatile resistive memories, a crossbar array (e.g., see 200 of FIG. 2) is desirably able to perform parallel vector-multiply operations. Thus, by providing pulse width modulator variation in different manners, some of the approaches included herein are able to provide sufficient accuracy and a larger bit-precision than conventionally achievable without introducing latency, while also exponentially reducing power consumption.

Figure 4A:
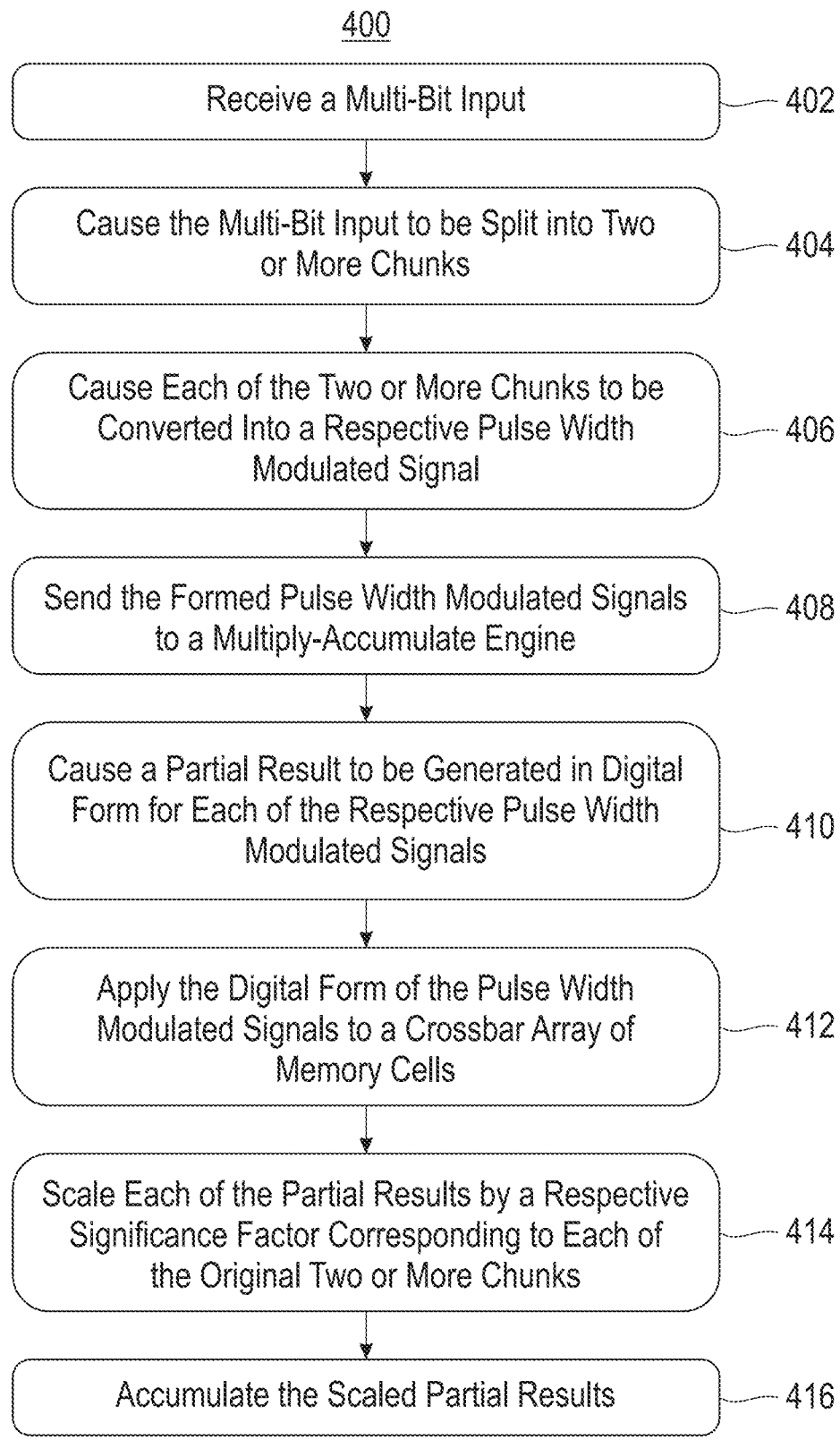
FIG. 4A is a flowchart of a method, in accordance with one embodiment.

For instance, looking now to FIG. 4A, flowcharts of a method 400 for efficient encoding multi-bit neural network activations in the time domain are shown in accordance with one embodiment. These improvements may result from implementing split pulse modulation for implementations such as analog AI processors, e.g., as will be described in further detail below. The method 400 may be performed in accordance with the present invention in any of the environments depicted in FIGS. 1-3, among others, in various embodiments. Of course, more or less operations than those specifically described in FIG. 4A may be included in any of method 400, as would be understood by one of skill in the art upon reading the present descriptions.

Each of the steps of the method 400 may be performed by any suitable component of the operating environment. For example, in some embodiments any one or more of the processes included in method 400 may be performed by a central storage controller in communication with (e.g., coupled to) various pulse width modulators. In various other embodiments, any of the processes in method 400 may be partially or entirely performed by a controller, a processor, a computer, etc., or some other device having one or more processors therein. Moreover, the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module (s) implemented in hardware and/or software, and preferably having at least one hardware component may be utilized in any device to perform one or more steps of the method 400. Illustrative processors include, but are not limited to, a central processing unit (CPU), an application specific integrated circuit (ASIC), a field programmable gate array (FPGA), etc., combinations thereof, or any other suitable computing device known in the art.

As shown, operation 402 of FIG. 4A includes receiving a multi-bit input. With respect to the present description, the "multi-bit input" includes information which may be used to determine a desired amount of time that elapses between the leading and trailing edges of various pulses of energy. As noted above, characteristics of a pulse that is applied to a crossbar array may impact the effect which the pulse actually has. For instance, pulse width modulators are involved with providing a formulation in which each row excitation is applied as a different length pulse. A multi-bit input may thereby be applied by a pulse width modulator by supplying pulses of energy for excitation periods that correspond to information included in the multi-bit input, e.g., as would be appreciated by one skilled in the art after reading the present description. It should also be noted that the multi-bit input may be received from a user, a running application, a lookup table, a compute-block affiliated with a previous layer of the neural network, etc.

As noted above, pulse width modulators may be used to apply energy pulses of certain lengths (e.g., durations) to specific ones of the linear extensions (e.g., rows and/or columns) in a crossbar array. In such approaches, each pulse width modulator may correlate with a unique row or column in an analog crossbar array. It follows that the use of the terms "row" and "column" as used herein are in no way intended to limit the invention. In some approaches columns and rows may even be used interchangeably, e.g., depending on the configuration of the crossbar array and/or the components included therein. The analog crossbar array may further be implemented in resistive memory in some instances, e.g., such as RRAM or PCM. Each of the pulse width modulators may thereby be correlated with a specific row or column of RRAM or PCM circuitry.

In some approaches, the multi-bit input may actually identify which of the pulse width modulators it is correlated with. For instance, the multi-bit input may include metadata which indicates which pulse width modulator is associated with the input. However, the correlation between the multi-bit input and specific pulse width modulators may be established using any desired information and/or processes.

With continued reference to FIG. 4A, operation 404 includes causing the multi-bit input to be split into two or more chunks, each of the two or more chunks including at least one individual bit. While the number of chunks that are created may vary depending on the particular implementation, it should be noted that each chunk preferably includes two or more different bits. This desirably limits quantization errors and actually improves temporal-based efficiencies of the system.

Moreover, depending on the approach, the number of chunks and/or the number of individual bits that are represented by each of the chunks may be predetermined by a user, be calculated based on past iterations, be determined based on the type of memory and/or industry standards, etc.

According to an example, which is in no way intended to limit the invention, a 7-bit register (which would otherwise involve applying pulses having widths from 0 to 127 nanoseconds) may be implemented as a 4-bit and 3-bit register. This results in two pulses ultimately being applied, one of which may span from 0 to 15 nanoseconds, and the other may span from 0 to 7 nanoseconds. Unlike the conventional bit-slicing attempts noted above, quantization noise is effectively eliminated using some of the embodiments that are included herein.

The mapping into durations quantized in units of nanoseconds is used for illustrative purposes only. Any linear mapping of bit-value into duration may be used, so long as the correct scaling between the different portions of the original register is used when combining the results. For instance, the current measured during the first period of 0-15 nanoseconds could be scaled by 8 within the analog regime, within the digital regime after measurement and quantization, or in some combined manner. Similarly, one could scale up the 0-15 nanosecond measurement by some first factor, and scale down the 0-7 nanosecond measurement by some second factor, so long as the product of the two factors implemented the original scaling factor of 8.

Proceeding to operation 406, method 400 includes causing each of the two or more chunks to be converted into a respective pulse width modulated signal. It follows that the pulse width modulated signals may collectively represent the multi-bit input. Pulse width modulation is a method of reducing the average power delivered by an electrical signal, by effectively dividing it into discrete parts. The average value of voltage (and current) fed to the load is controlled by turning a switch between a supply and a load on and off according to the discrete parts of the signal. Moreover, the longer the switch is kept on compared to periods where it is kept off, the higher the total power that is ultimately supplied to the load.

The two or more chunks may actually be converted by one or more pulse width modulators in some approaches. These pulse width modulators may be coupled to or at least associated with the one or more rows or columns of the crossbar array which the initial multi-bit input corresponded to. The number of pulse width modulators that are used to convert the chunks may depend on the number of chunks, the size of the chunks, the configuration of the crossbar array, etc.

The pulse width modulated signals formed are further sent to a multiply-accumulate (MAC) engine. See operation 408. The MAC engine (or multiplier accumulator unit) is able to perform MAC operations and may thereby be used to actually process the pulse width modulated signals. For instance, in some approaches the MAC engine may perform multiplication and accumulation processes on the pulse width modulated signals. It should also be noted that the MAC engine may include a multiplier, adder, accumulator, etc., and/or other components which would be apparent by one skilled in the art after reading the present description.

It follows that in some approaches the MAC engine may be used to create the digital form of each of the pulse width modulated signals. Operation 410 thereby includes causing a partial result to be generated in digital form for each of the respective pulse width modulated signals. In other words, operation 410 includes digitizing each of the pulse width modulated signals.

Figure 4B:
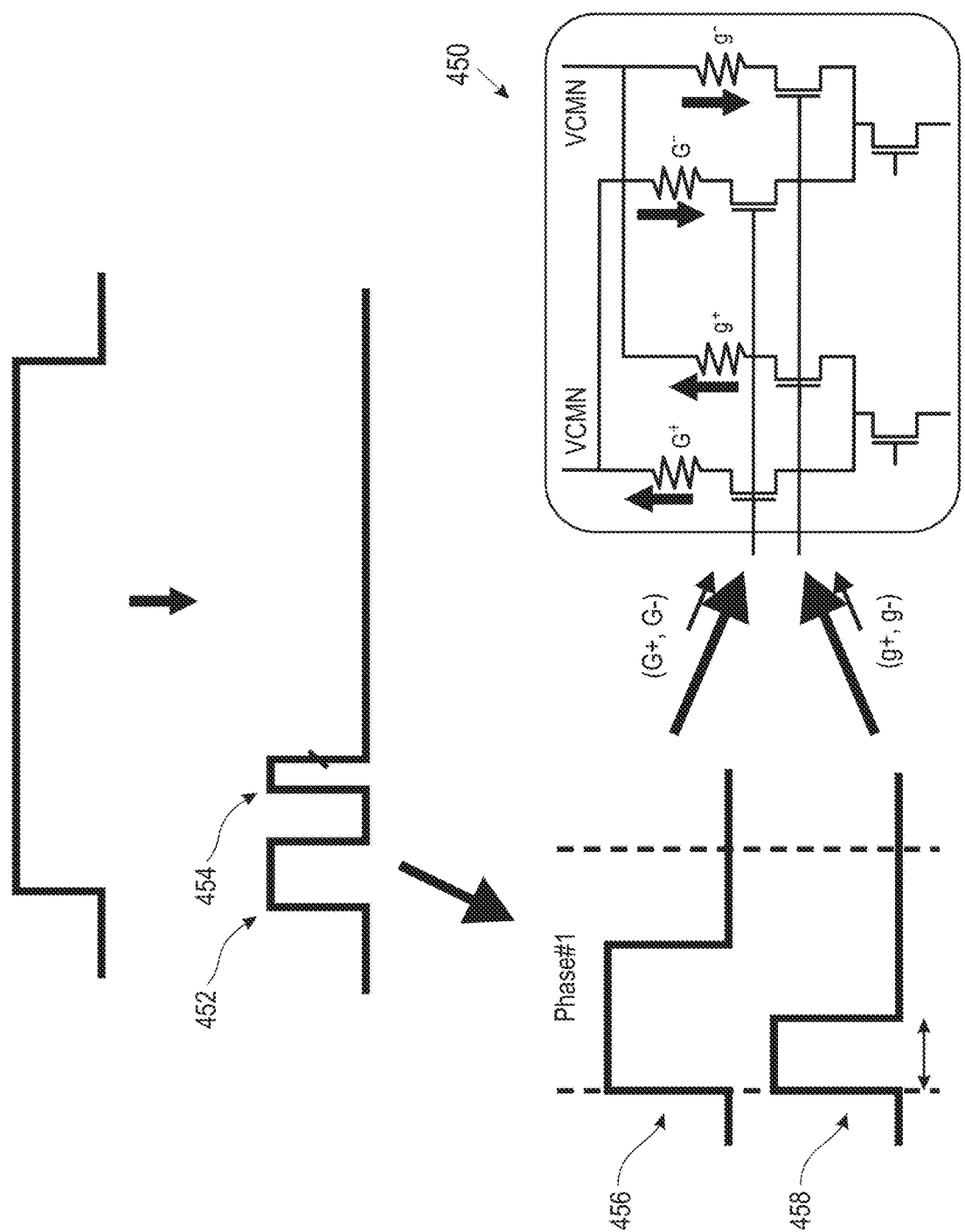
Figure 4D:
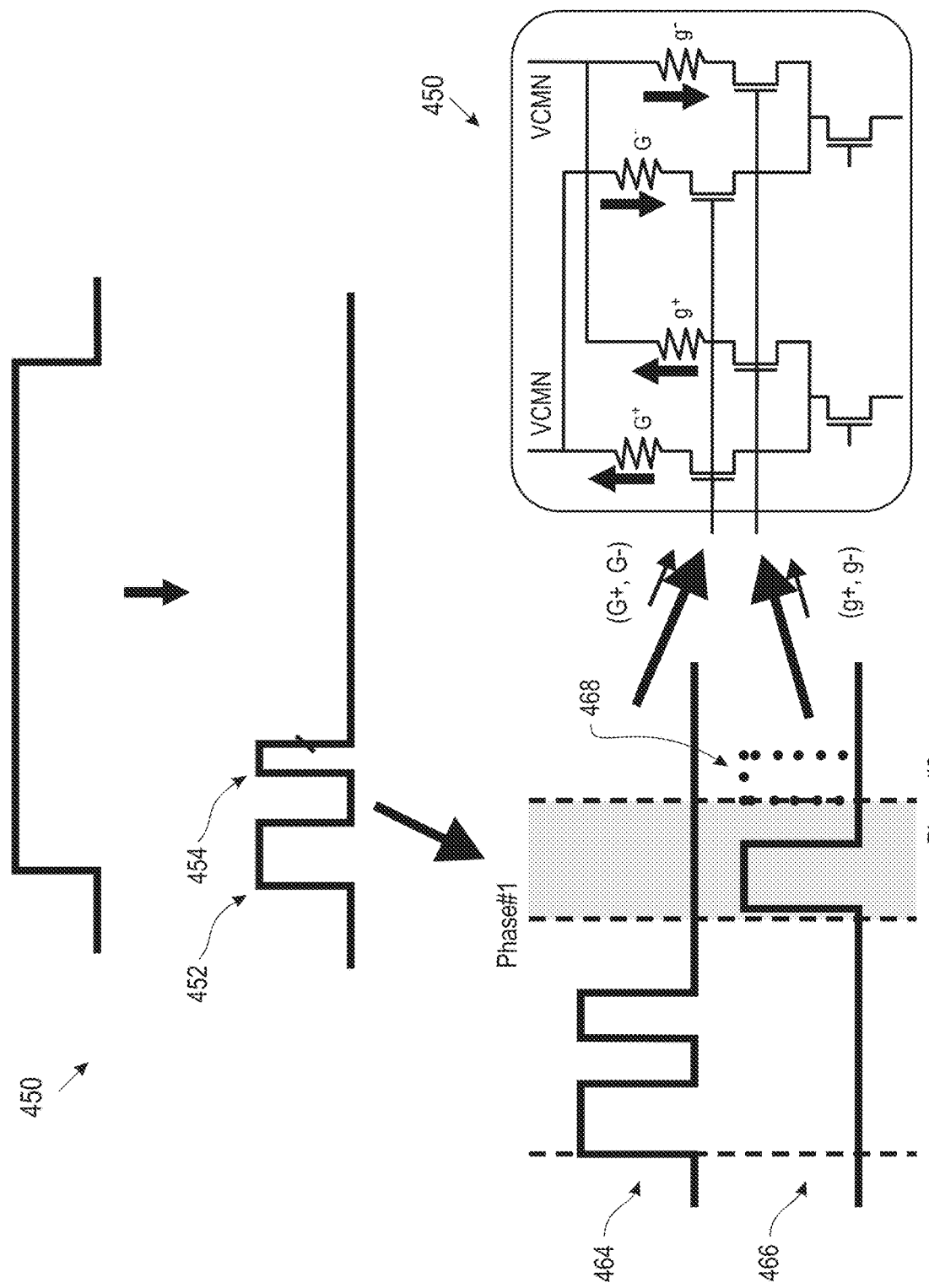

The digital form of these pulse width modulated signals are further applied to a crossbar array of memory cells in operation 412. Depending on the approach, the digital representations of these signals may be applied differently. In fact, in some approaches the digital versions of the pulse width modulated signals may not even be used. For instance, FIGS. 4B-4D are discussed in further detail below and illustrate sub-processes that are associated with applying the pulse width modulated signals to a crossbar array of memory cells in accordance with three different approaches which are in no way intended to limit the invention.

With continued reference to operation 412 of FIG. 4A, it should be noted that the process of splitting the multi-bit input into different chunks can ultimately reduce the overall pulse width applied to the crossbar array by assigning different significance values to the different chunks. For instance, examining the same example as discussed above which is again in no way intended to limit the invention, a 7-bit register may be implemented as a 4-bit register and a 3-bit register, where the 4-bits are more significant than the 3-bits. In other words, the 4-bit register may correspond to a higher level of significance (e.g., includes the most significant bit) while the 3-bit register may correspond to a lower level of significance (e.g., includes the least significant bit). This results in two pulses ultimately being applied, one of which may span from 0 to 15 nanoseconds, and the other may span from 0 to 7 nanoseconds. It follows that while integrating the higher-significance 4-bits of the 7-bit register, the fundamental count-unit within an associated analog-to-digital converter (ADC) might be 8, thereby reflecting the fact that each 1 nanosecond of this particular integration is worth 8 times the value of each 1 nanosecond of the subsequent integration corresponding to the lower significance 3-bits.

It follows that each of the pulses that are ultimately applied to the crossbar array undergo a significance factor to account for the significance that is associated therewith. In other words, the pulses applied to the crossbar array which represent the higher-significance 4-bits of the 7-bit register in the example above are preferably boosted by a significance factor that accounts for the higher significance, e.g., at least in comparison to the relatively lower significance of the remaining 3-bits. Accordingly, operation 414 includes scaling each of the partial results by a respective significance factor corresponding to each of the original two or more chunks. As noted above, this effectively accounts for the different significances of the chunks that are formed. Again, increases in precision have conventionally resulted in significant temporal inefficiencies. However, accounting for the different significances by applying a significance factor after the pulses have been applied desirably mitigates this conventional issue.

The significance factor may be determined and correlated with the different chunks during the process of actually forming the chunks themselves in some approaches. This desirably allows for the initial significance of the different chunks to be derived from the initial multi-bit signal and maintained. In other approaches information pertaining to the significances of the various bits in the multi-bit input may be stored in a lookup table, somehow appended to each of the chunks formed, etc.

In some approaches the scaling may actually be performed by a dedicated component and/or using specific processes. For instance, in some approaches scaling each of the partial results by the respective significance factors may actually be performed by one of the pulse width modulators. It follows that operation 414 may actually include sending one or more instructions to (e.g., causing) a dedicated component to scale each of the partial results by a respective significance factor, e.g., as would be appreciated by one skilled in the art after reading the present description.

With continued reference to FIG. 4A, the scaled partial results may be accumulated. See operation 416. By accumulating the scaled partial results, method 400 is able to reconstruct the multi-bit input originally received. It follows that method 400 may end in response to performing operation 416. However, it should be noted that although method 400 may end, any one or more of the processes included in method 400 may be repeated in order to process another multi-bit input. In other words, any one or more of the processes included in method 400 may be repeated for subsequently received multi-bit inputs.

As noted above, the digital forms of pulse width modulated signals may be applied to a crossbar array of memory cells differently depending on the approach. For instance, FIGS. 4B-4D again illustrate sub-processes that are associated with applying the pulse width modulated signals to a crossbar array of memory cells in accordance with three different approaches which are in no way intended to limit the invention. While these three different approaches differ in their implementation, it should be noted that they are presented in the context of the same example scenario involving a pulse having 7-bits of magnitude that is split into a more significant 4-bits and a less significant 3-bits, which is in no way intended to limit the invention.

Looking first to FIG. 4B, it is again noted that the initial pulse having 7-bits of magnitude is split into a more significant 4-bit chunk 452 and a less significant 3-bit chunk 454. As shown, the pulses corresponding to the two chunks are notably shorter in terms of total time in comparison to the initial pulse. To account for this compression, a significance factor may be used to scale the more significant 4-bit chunk 452 appropriately in comparison to the less significant 3-bit chunk 454.

The two smaller chunks are further applied to the appropriate rows (or columns) of a crossbar array 450 in a single phase such that the leading edge of the two pulses coincide. The fact that the pulses are applied in a single phase may allow for the difference in significance between the 4-bit chunk 452 and a less significant 3-bit chunk 454 to be represented by the ratio of duration for the two pulses 456, 458 that are ultimately applied. In other words, a pulse that is half the duration of another may be determined as corresponding to one or more bits that are half as significant, e.g., as would be appreciated by one skilled in the art after reading the present description.

Looking now to FIG. 4C, it is again noted that the initial pulse having 7-bits of magnitude is split into the more significant 4-bit chunk 452 and the less significant 3-bit chunk 454. The two smaller chunks are further combined and applied in a sequential manner to the appropriate rows (or columns) of a crossbar array 450. In other words, a first set of pulses 460 are applied in a first phase to one column of the crossbar array 450, while a second set of pulses 462 are applied in a second phase to another column of the crossbar array 450.

Because the sets of pulses 460, 462 are applied in different phases, the difference in significance cannot be represented by the ratio of duration for the pulses that are ultimately applied. Rather, the relative significance of the different sets of pulses 460, 462 may be represented in the digital domain, e.g., as described above. Accordingly, information pertaining to the digital representation of the various pulses may ultimately be used to apply the appropriate significance factor to account for the appropriate significances. The different phases themselves may also be used in some approaches to identify the relative significance of the corresponding pulses. For instance, pulses applied in the first phase may be more significant (e.g., correspond to more significant bits) than the pulses that are applied in the second phase.

Looking finally to FIG. 4D, it is once again noted that the initial pulse having 7-bits of magnitude is split into the more significant 4-bit chunk 452 and the less significant 3-bit chunk 454. The two smaller chunks are further combined and applied in a sequential manner to the appropriate rows (or columns) of a crossbar array 450. In other words, a first set of pulses 464 are applied in a first phase to one column of the crossbar array 450, while a second set of pulses 466 are applied in a second phase to another column of the crossbar array 450.

Again, because the sets of pulses 464, 466 are applied in different phases, the difference in significance cannot be represented by the ratio of duration for the pulses that are ultimately applied. Rather, the relative significance of the different sets of pulses 464, 466 may be represented in the digital domain, e.g., as described above. Accordingly, information pertaining to the digital representation of the various pulses may ultimately be used to apply the appropriate significance factor to account for the appropriate significances. The different phases themselves may also be used in some approaches to identify the relative significance of the corresponding pulses. For instance, pulses applied in the first phase may be more significant (e.g., correspond to more significant bits) than the pulses that are applied in the second phase.

It should also be noted that the final pulse 468 in the second set of pulses 466 may be ignored in some approaches. In other words, the pulse corresponding to the least significant bit in the second set of pulses (or second phase) is not actually applied to the crossbar array. This final pulse 468 has thereby been represented with a dashed line to indicate this possibility of being ignored (not applied). In some situations, the value (e.g., detail) that the least significant bit(s) provide may be sufficiently low that the temporal resources gained by ignoring it may be desirable. As a result, throughput as well as the energy efficiency of the overall system is improved due to the fact that computes may be performed in less wall clock time than conventionally achievable.

It should also be appreciated by those skilled in the art that a circuit configuration in which positive and negative excitation values are time-multiplexed into at least two temporally-separated phases can have each of these phases organized into a multi-bit pulse width modulator as described herein. Such a multi-phase excitation may arise because of unavoidable limitations in the way that currents are accumulated from the crossbar array. Even so, the techniques taught herein can still be used to complete each of these phases in less total time than prior-art techniques.

Figure 5:
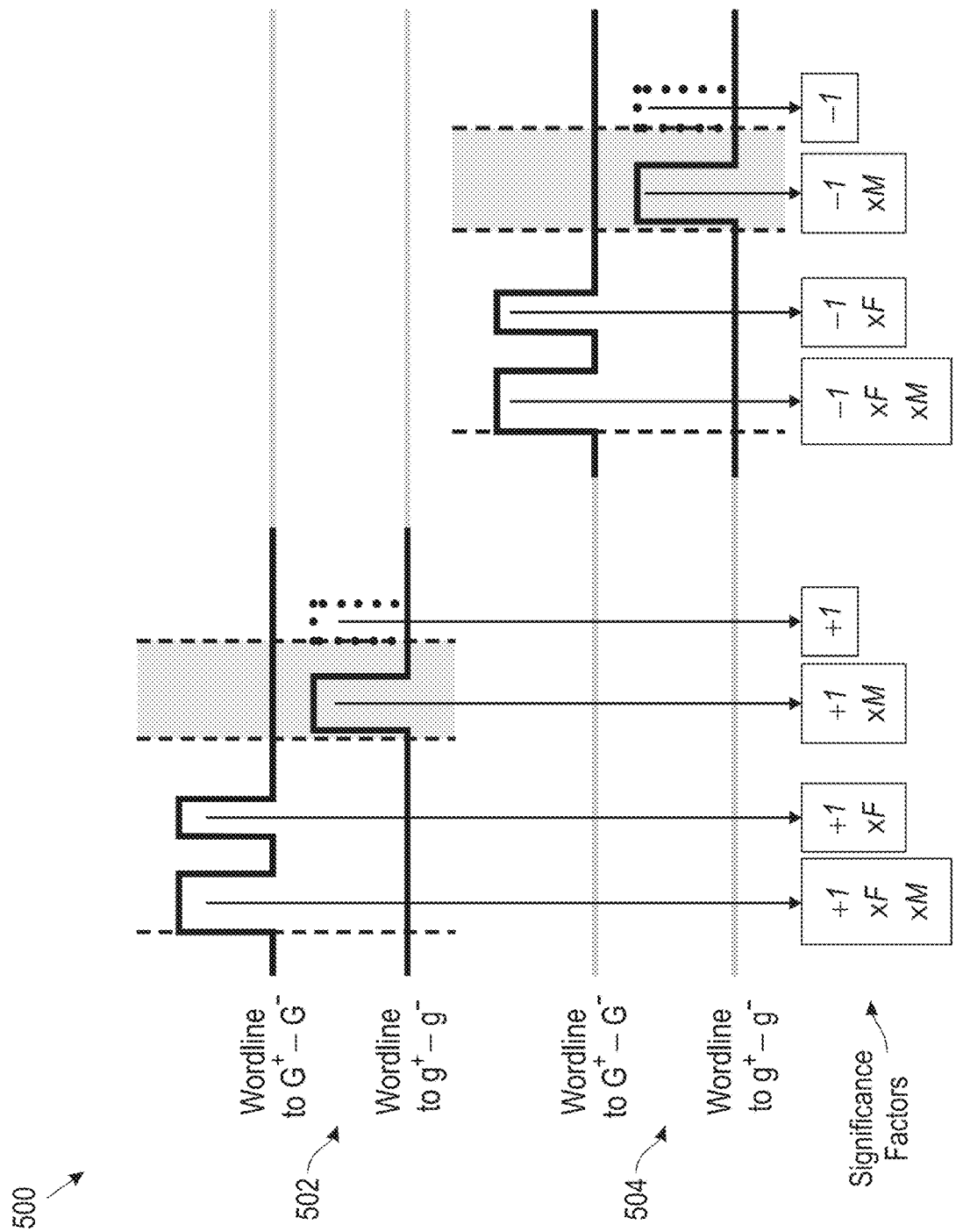
FIG. 5 is a partial representational view of a diagram, in accordance with an in-use example.

For instance, looking now to FIG. 5, a representational diagram 500 of how a pulse width modified excitation that involves both a positive excitation portion 502 and a negative excitation portion 504 is illustrated in accordance with an in-use example which is in no way intended to limit the invention. As shown, the diagram 500 involves an excitation that spans temporally from a start time (e.g., t=0) to an end time of $2^N$. Here "N" represents the total size of the PWM register associated with applying the excitation, which has been separated into a first 4-bit portion and a second 3-bit portion. Moreover, "M" represents the difference between the value of "N" and the first portion of the register. Accordingly, in the present example M is equal to 3.

It should also be noted that PMW excitation may be first applied as 0 to the time corresponding to $(2^{N-M}-1)$, followed by 0 to the time corresponding to $(2^M-1)$. Furthermore, the excitations are applied to two different wordlines in the present example. Specifically, the excitations are applied to a first wordline that corresponds to $G^+$-$G^-$, as well as a second wordline that corresponds to $g^+$-$g^-$ (e.g., see FIGS. 4B-4D). As noted above, by applying a different significance factor to each of the excitations, the present example is able to maintain the significance if the various bits of information while also reducing the temporal delays associated with actually implementing the excitations. Accordingly, the value of the excitations applied to the first wordline may be "F" times larger than the value of the excitations applied to the second wordline.

With continued reference to FIG. 5, the pulse width modified excitation involves both a positive excitation portion and a negative excitation portion. The positive excitations are illustrated as being performed at an earlier time than the negative excitations. Specifically, a first subset of positive excitations is applied to the first wordline, and a second subset of the positive excitations are applied to the second wordline thereafter. Similarly, a first subset of negative excitations is applied to the first wordline, and a second subset of the negative excitations are applied to the second wordline thereafter.

The significance factor for each of the excitations that are applied to the wordlines may be determined by incorporating the lower significance portion of the excitations "M" and the factor "F" by which the values of the excitations applied to the first wordline may are greater than the values of the excitations applied to the second wordline.

For instance, the significance factor associated with the first excitation applied to the first wordline may be calculated as +1(F)(M), while the significance factor associated with the second excitation applied to the first wordline may be calculated as +1(F). Similarly, the significance factor associated with the second excitation applied to the first wordline may be calculated as +1(M).

As noted above, the final pulse in the second set of pulses may be ignored in some approaches. In other words, the pulse corresponding to the least significant bit in the second set of pulses (or second phase) is not actually applied to the crossbar array. This final pulse has thereby been represented with a dashed line to indicate this possibility of being ignored (not applied). In some situations, the value (e.g., detail) that the least significant bit(s) provide may be sufficiently low that the temporal resources gained by ignoring it may be desirable. As a result, throughput as well as the energy efficiency of the overall system is improved due to the fact that computes may be performed in less wall clock time than conventionally achievable. However, in situations where the final pulse is actually applied, the significance factor may simply be +1. The +1 corresponds to the fact that the first excitations are positive excitations.

Looking to the first set of negative excitations, the significance factors are determined using a negative value, e.g., as would be appreciated by one skilled in the art after reading the present description.

It follows that the significance factor associated with the first negative excitation applied to the first wordline may be calculated as −1(F)(M), while the significance factor associated with the second negative excitation applied to the first wordline may be calculated as −1(F). Similarly, the significance factor associated with the second negative excitation applied to the first wordline may be calculated as −1(M) and the significance factor associated with the second negative excitation applied to the second wordline (e.g., in some situations) may be calculated simply as −1. These significance factors are applied to the integrated current being supplied to the respective wordlines, e.g., as would be appreciated by one skilled in the art after reading the present description.

It follows that careful consideration is preferably made of the appropriate scaling that is performed on the integrated signals to make sure that the proper MAC operation is performed. In other words, the more significant 4 bits of a larger bit sequence may result in a pulse being fired that is only 15 nanoseconds long, so long as the resulting integrated current is scaled appropriately. Moreover, this scaling can be performed in the analog domain, the digital domain, and/or some combination thereof.

Similarly, if a 15 nanosecond (e.g., from t=0 to 15 nanoseconds) pulse is applied to the G+/G− devices and then later a 15 nanosecond pulse is applied to the g+/g− devices, the intended significance factor F is preferably implemented, either implicitly in the fact that the G+/G− values are programmed to inherently larger values than the g+/g− devices, or that the analog current is amplified, or that the integrated current values are upshifted. These values are thereby combined to deliver the precise significance factor of F.

It should also be noted that although FIG. 5 shows a number of integration phases that are arranged in sequential order and performed one after the other, it should be apparent to those skilled in the art that two or more of these phases may be performed in parallel during the same time period, so long as the total significance of the two or more partial signals can be properly adjusted before their combination into a single MAC results. For instance, rather than two of these phases be performed sequentially using the same bitline for integration, two different bitlines could be used, with one providing a different analog or digital gain in order to correctly adjust the significance values of each phase and produce the intended MAC result. Similarly, it should be apparent to those skilled in the art after reading the present description that these phases can be performed in any arbitrary order.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 6:
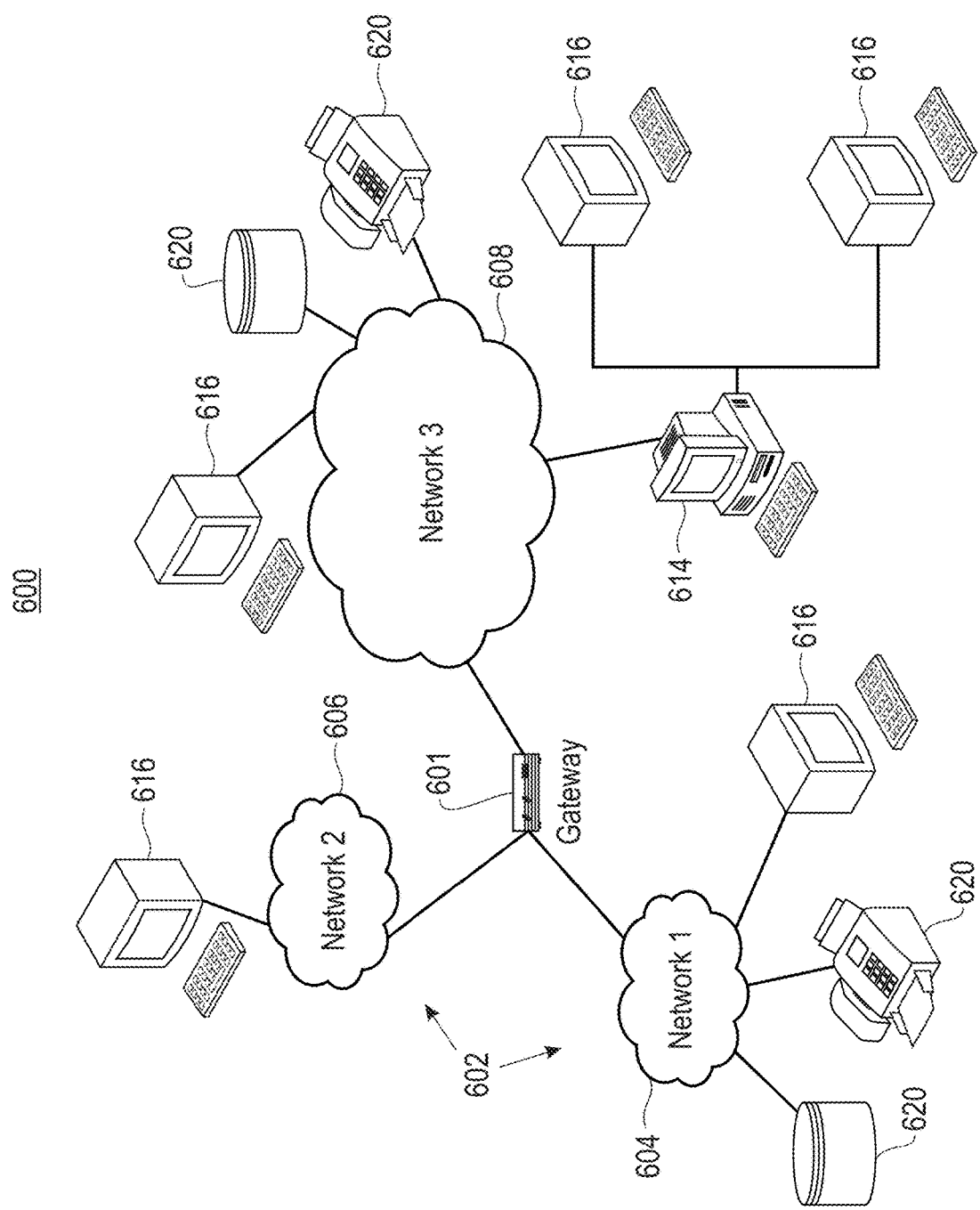
FIG. 6 is a network architecture, in accordance with one embodiment.

For instance, FIG. 6 illustrates a network architecture 600, in accordance with one embodiment. As shown in FIG. 6, a plurality of remote networks 602 are provided including a first remote network 604 and a second remote network 606. A gateway 601 may be coupled between the remote networks 602 and a proximate network 608. In the context of the present network architecture 600, the networks 604, 606 may each take any form including, but not limited to a LAN, a WAN such as the Internet, public switched telephone network (PSTN), internal telephone network, etc.

In use, the gateway 601 serves as an entrance point from the remote networks 602 to the proximate network 608. As such, the gateway 601 may function as a router, which is capable of directing a given packet of data that arrives at the gateway 601, and a switch, which furnishes the actual path in and out of the gateway 601 for a given packet.

Further included is at least one data server 614 coupled to the proximate network 608, and which is accessible from the remote networks 602 via the gateway 601. It should be noted that the data server(s) 614 may include any type of computing device/groupware. Coupled to each data server 614 is a plurality of user devices 616. Such user devices 616 may include a desktop computer, laptop computer, handheld computer, printer, and/or any other type of logic-containing device. It should be noted that a user device 611 may also be directly coupled to any of the networks, in some embodiments.

A peripheral 620 or series of peripherals 620, e.g., facsimile machines, printers, scanners, hard disk drives, networked and/or local data storage units or systems, etc., may be coupled to one or more of the networks 604, 606, 608. It should be noted that databases and/or additional components may be utilized with, or integrated into, any type of network element coupled to the networks 604, 606, 608. In the context of the present description, a network element may refer to any component of a network.

According to some embodiments, methods and systems described herein may be implemented with and/or on virtual systems and/or systems which emulate one or more other systems, such as a UNIX® system which virtually hosts a known operating system environment, etc. This virtualization and/or emulation may be enhanced through the use of VMware® software, in some embodiments.

In other embodiments, one or more networks 604, 606, 608, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 7:
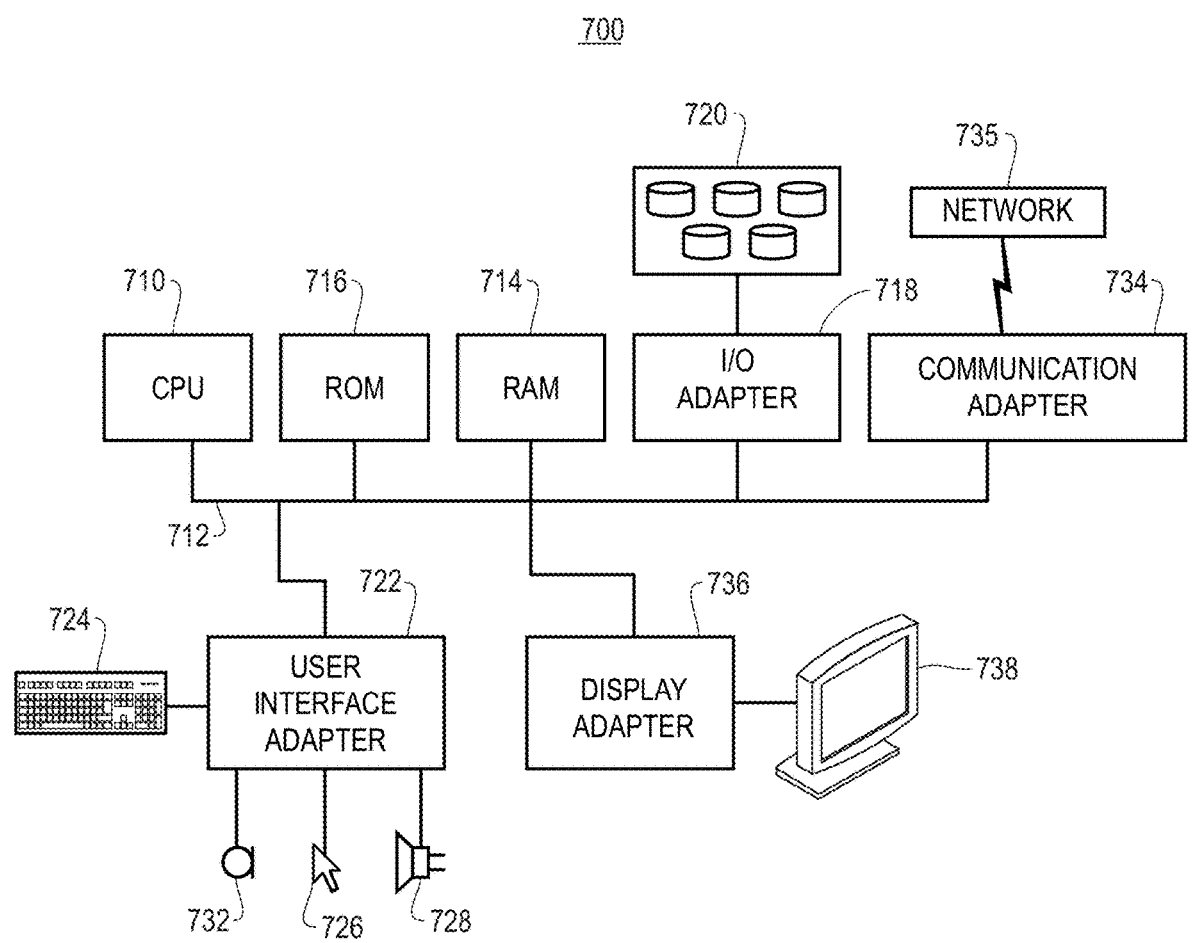
FIG. 7 is a representative hardware environment that may be associated with the servers and/or clients of FIG. 6, in accordance with one embodiment.

FIG. 7 shows a representative hardware environment associated with a user device 616 and/or server 614 of FIG. 6, in accordance with one embodiment. FIG. 7 illustrates a typical hardware configuration of a processor system 700 having a central processing unit 710, such as a microprocessor, and a number of other units interconnected via a system bus 712, according to one embodiment. In some embodiments, central processing unit 710 may include any of the approaches described above.

The processor system 700 shown in FIG. 7 includes a Random Access Memory (RAM) 714, Read Only Memory (ROM) 716, and an I/O adapter 718. According to some embodiments, which are in no way intended to limit the invention, I/O adapter 718 may include any of the approaches described above. Referring still to processor system 700 of FIG. 7, the aforementioned components 714, 716, 718 may be used for connecting peripheral devices such as storage subsystem 720 to the bus 712. In some embodiments, storage subsystem 720 may include a similar and/or the same configuration as any of the approaches included herein. According to an example, which is in no way intended to limit the invention, storage subsystem 720 may include non-volatile data storage cards, e.g., having NVRAM memory cards, RAM, ROM, and/or some other known type of non-volatile memory, in addition to RAID controllers.

With continued reference to FIG. 7, a user interface adapter 722 for connecting a keyboard 724, a mouse 726, a speaker 728, a microphone 732, and/or other user interface devices such as a touch screen, a digital camera (not shown), etc., to the bus 712.

Processor system 700 further includes a communication adapter 734 which connects the processor system 700 to a communication network 735 (e.g., a data processing network) and a display adapter 736 which connects the bus 712 to a display device 738.

The processor system 700 may have resident thereon an operating system such as the Microsoft® Windows® Operating System (OS), a macOS®, a UNIX® OS, etc. It will be appreciated that a preferred embodiment may also be implemented on platforms and operating systems other than those mentioned. A preferred embodiment may be written using Java®, XML, C, and/or C++ language, or other programming languages, along with an object oriented programming methodology. Object oriented programming (OOP), which has become increasingly used to develop complex applications, may be used.

Figure 8:
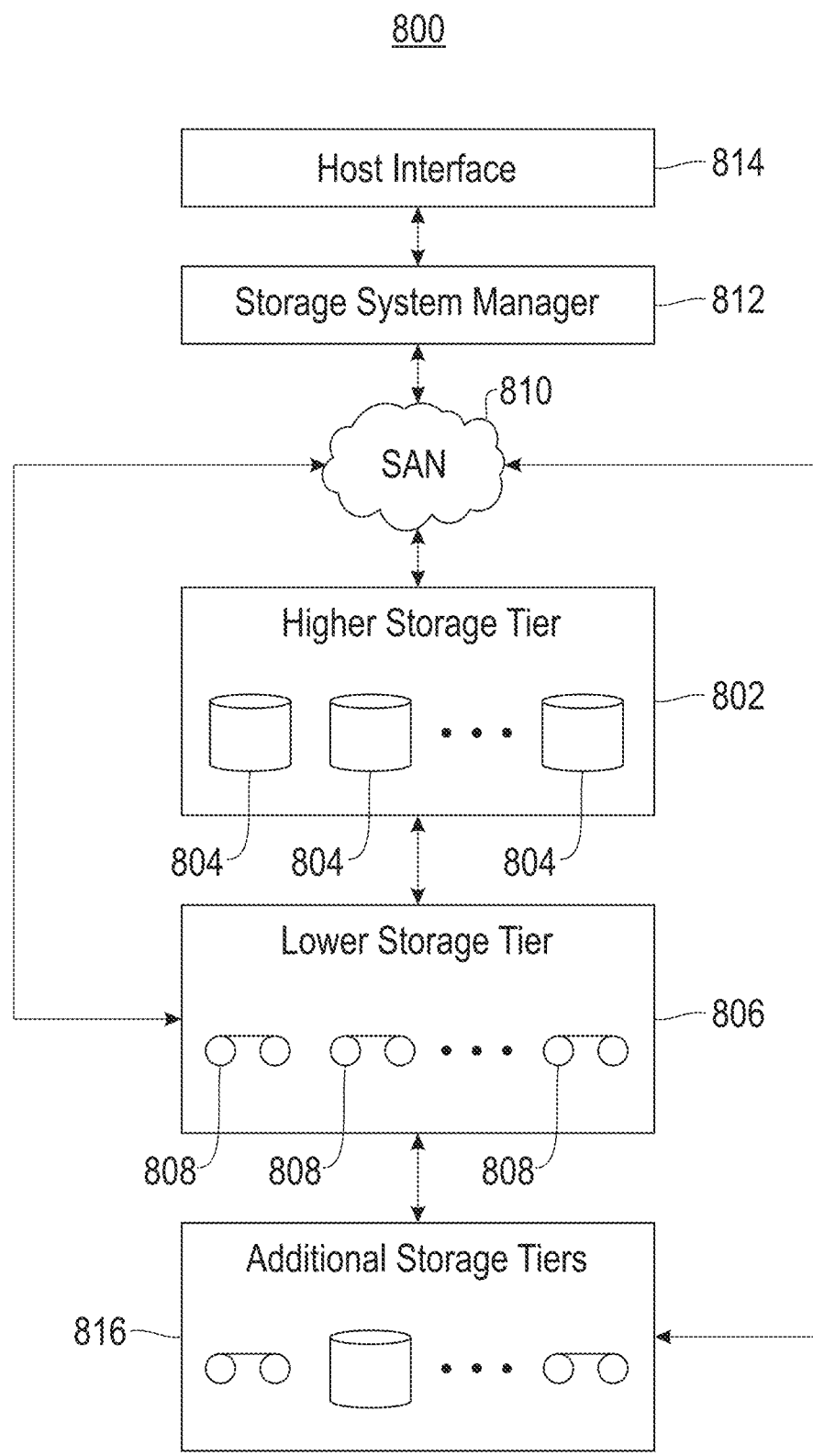
FIG. 8 is diagram of a tiered data storage system in accordance with one embodiment.

Moreover, FIG. 8 illustrates a storage system 800 which implements high level (e.g., SSD) storage tiers in combination with lower level (e.g., magnetic tape) storage tiers, according to one embodiment. Note that some of the elements shown in FIG. 8 may be implemented as hardware and/or software, according to various embodiments. The storage system 800 may include a storage system manager 812 for communicating with a plurality of media on at least one higher storage tier 802 and at least one lower storage tier 806. However, in other approaches, a storage system manager 812 may communicate with a plurality of media on at least one higher storage tier 802, but no lower storage tier. The higher storage tier(s) 802 preferably may include one or more random access and/or direct access media 804, such as hard disks, NVM, NVRAM, solid state memory in SSDs, MRAM, SSD arrays, flash memory arrays, etc., and/or others noted herein or known in the art. According to illustrative examples, FIGS. 3-4 show exemplary architectures of SSD systems which may be used as a higher storage tier 802 depending on the desired embodiment.

Referring still to FIG. 8, the lower storage tier(s) 806 preferably includes one or more lower performing storage media 808, including sequential access media such as magnetic tape in tape drives and/or optical media, slower accessing HDDs, slower accessing SSDs, etc., and/or others noted herein or known in the art. One or more additional storage tiers 816 may include any combination of storage memory media as desired by a designer of the system 800. Thus, the one or more additional storage tiers 816 may, in some approaches, include a SSD system architecture similar to those that would be apparent to one skilled in the art after reading the present description. Also, any of the higher storage tiers 802 and/or the lower storage tiers 806 may include any combination of storage devices and/or storage media.

The storage system manager 812 may communicate with the storage media 804, 808 on the higher storage tier(s) 802 and lower storage tier(s) 806 through a network 810, such as a storage area network (SAN), as shown in FIG. 8, or some other suitable network type. The storage system manager 812 may also communicate with one or more host systems (not shown) through a host interface 814, which may or may not be a part of the storage system manager 812. The storage system manager 812 and/or any other component of the storage system 800 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 800 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 802, may include a majority of SSD storage media for storing data in a higher performing storage environment, and remaining storage tiers, including lower storage tier 806 and additional storage tiers 816 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 802, while data not having one of these attributes may be stored to the additional storage tiers 816, including lower storage tier 806. Of course, one of skill in the art, upon reading the present descriptions, may devise many other combinations of storage media types to implement into different storage schemes, according to the embodiments presented herein.

According to some embodiments, the storage system (such as 800) may include logic configured to receive a request to open a data set, logic configured to determine if the requested data set is stored to a lower storage tier 806 of a tiered data storage system 800 in multiple associated portions, logic configured to move each associated portion of the requested data set to a higher storage tier 802 of the tiered data storage system 800, and logic configured to assemble the requested data set on the higher storage tier 802 of the tiered data storage system 800 from the associated portions.

Of course, this logic may be implemented as a method on any device and/or system or as a computer program product, according to various embodiments.

What is claimed is:

1. A computer-implemented method, comprising:
   causing a multi-bit input to be split into two or more chunks, wherein each of the two or more chunks include at least one individual bit;

causing each of the two or more chunks to be converted into a respective pulse width modulated signal;

causing a partial result to be generated in digital form for each of the respective pulse width modulated signals;

scaling each of the partial results by a respective significance factor corresponding to each of the two or more chunks; and accumulating the scaled partial results.

2. The computer-implemented method of claim 1, comprising:

causing the digital form of the partial results to be applied to a crossbar array of memory cells by:

causing a pulse width modulator to apply a first set of pulses to the crossbar array in a first phase, the first set of pulses corresponding to a first subset of the partial results; and causing the pulse width modulator to apply a second set of pulses to the crossbar array in a second phase, the second set of pulses corresponding to a second subset of the partial results.

3. The computer-implemented method of claim 2, wherein the pulses applied to the crossbar array in the first phase correspond to a higher significance than the pulses applied to the crossbar array in the second phase.

4. The computer-implemented method of claim 3, wherein causing the pulse width modulator to apply a second set of pulses to the crossbar array in a second phase includes:

ignoring a final pulse in the second set of pulses.

5. The computer-implemented method of claim 2, wherein the crossbar array is an analog crossbar array in resistive memory.

6. The computer-implemented method of claim 5, wherein the resistive memory is Phase Change Memory (PCM).

7. The computer-implemented method of claim 5, wherein the resistive memory is Resistive Random Access Memory (RRAM).

8. The computer-implemented method of claim 1, wherein the partial results are generated in digital form by a multiply-accumulate engine.

9. The computer-implemented method of claim 1, wherein each of the two or more chunks include two or more individual bits.

10. A computer program product comprising a computer readable storage medium having program instructions embodied therewith, the program instructions readable and/or executable by a processor to cause the processor to:

cause, by the processor, a multi-bit input to be split into two or more chunks, wherein each of the two or more chunks include at least one individual bit;

cause, by the processor, each of the two or more chunks to be converted into a respective pulse width modulated signal;

cause, by the processor, a partial result to be generated in digital form for each of the respective pulse width modulated signals;

scale, by the processor, each of the partial results by a respective significance factor corresponding to each of the two or more chunks; and accumulate, by the processor, the scaled partial results.

11. The computer program product of claim 10, wherein the program instructions are readable and/or executable by the processor to cause the processor to:

cause, by the processor, the digital form of the partial results to be applied to a crossbar array of memory cells by:

causing a pulse width modulator to apply a first set of pulses to the crossbar array in a first phase, the first set of pulses corresponding to a first subset of the partial results; and causing the pulse width modulator to apply a second set of pulses to the crossbar array in a second phase, the second set of pulses corresponding to a second subset of the partial results.

12. The computer program product of claim 11, wherein the pulses applied to the crossbar array in the first phase correspond to a higher significance than the pulses applied to the crossbar array in the second phase.

13. The computer program product of claim 12, wherein causing the pulse width modulator to apply a second set of pulses to the crossbar array in a second phase includes:

ignoring a final pulse in the second set of pulses.

14. The computer program product of claim 11, wherein the crossbar array is an analog crossbar array in resistive memory.

15. The computer program product of claim 14, wherein the resistive memory is Phase Change Memory (PCM).

16. The computer program product of claim 14, wherein the resistive memory is Resistive Random Access Memory (RRAM).

17. The computer program product of claim 10, wherein the partial results are generated in digital form by a multiply-accumulate engine.

18. A system, comprising:

a processor; and logic integrated with the processor, executable by the processor, or integrated with and executable by the processor, the logic being configured to:

cause, by the processor, a multi-bit input to be split into two or more chunks, wherein each of the two or more chunks include at least one individual bit;

cause, by the processor, each of the two or more chunks to be converted into a respective pulse width modulated signal;

cause, by the processor, a partial result to be generated in digital form for each of the respective pulse width modulated signals;

scale, by the processor, each of the partial results by a respective significance factor corresponding to each of the two or more chunks; and accumulate, by the processor, the scaled partial results.

19. The system of claim 18, wherein the logic is configured to:

cause, by the processor, the digital form of the partial results to be applied to a crossbar array of memory cells by:

causing a pulse width modulator to apply a first set of pulses to the crossbar array in a first phase, the first set of pulses corresponding to a first subset of the partial results; and causing the pulse width modulator to apply a second set of pulses to the crossbar array in a second phase, the second set of pulses corresponding to a second subset of the partial results.

20. The system of claim 19, wherein the pulses applied to the crossbar array in the first phase correspond to a higher significance than the pulses applied to the crossbar array in the second phase, wherein causing the pulse width modulator to apply a second set of pulses to the crossbar array in a second phase includes: ignoring a final pulse in the second set of pulses.

* * * * *